United States Patent [19]

Ramacher et al.

[11] Patent Number: 4,951,220

[45] Date of Patent: Aug. 21, 1990

[54] METHOD AND APPARATUS FOR MANUFACTURING A TEST-COMPATIBLE, LARGELY DEFECT-TOLERANT CONFIGURATION OF REDUNDANTLY IMPLEMENTED, SYSTOLIC VLSI SYSTEMS

[75] Inventors: Ulrich Ramacher, Munich; Joerg Beichter, Esslingen, both of Fed. Rep. of Germany

[73] Assignee: Siemens Aktiengesellschaft, Berlin and Munich, Fed. Rep. of Germany

[21] Appl. No.: 236,844

[22] Filed: Aug. 26, 1988

[30] Foreign Application Priority Data

Sep. 22, 1987 [DE] Fed. Rep. of Germany ....... 3731833

[51] Int. Cl.⁵ .............................................. G06F 11/16
[52] U.S. Cl. ................................... 364/488; 364/578; 371/23; 371/36
[58] Field of Search ............... 364/488, 489, 490, 491, 364/578; 371/23, 26; 370/16

[56] References Cited

U.S. PATENT DOCUMENTS

| | | | |
|---|---|---|---|
| 3,961,250 | 6/1976 | Snethen | 371/23 |
| 4,527,249 | 7/1985 | Van Brunt | 371/23 |
| 4,583,224 | 4/1986 | Ishii et al. | 371/36 |
| 4,654,851 | 3/1987 | Busby | 371/23 |
| 4,719,626 | 1/1988 | Ogasawara | 371/23 |
| 4,744,084 | 5/1988 | Beck et al. | 371/23 |
| 4,747,102 | 5/1988 | Funatsu | 371/23 |
| 4,763,289 | 8/1988 | Barzilai et al. | 371/23 |
| 4,769,817 | 9/1988 | Krohn et al. | 371/23 |
| 4,782,440 | 11/1988 | Nomizu et al. | 371/23 |
| 4,817,094 | 3/1989 | Lebizay et al. | 371/36 |

OTHER PUBLICATIONS

"Wafer-Scale Integration-A-Fault-Tolerant Procedure", IEEE Journal of Solid State Circuits, vol. SC 13, No. 3, Jun., 1978, by Aubusson et al.
"Reconfigurable Architectures for VLSI Processing Arrays", Proceedings of the IEEE, vol. 74, No. 5, May 1986, by Sami et al.
"On the Design of Easily Testable & Reconfigurable VLSI Processor Arrays", Workshop on Designing for Yield, Oxford, 1982.
"A Cost Oriented Redundancy Model for Defect-Tolerant VLSI/WSI Systems", Adam Hilger, Jan., 1988, by Ramacher.

*Primary Examiner*—Parshotam S. Lall
*Assistant Examiner*—V. N. Trans
*Attorney, Agent, or Firm*—Hill, Van Santen, Steadman & Simpson

[57] ABSTRACT

A method and apparatus for the production of a test-compatible, largely defect-tolerant configuration of redundantly implemented, systolic VLSI systems. The method and apparatus for the configuration of redundantly implemented, systolic VLSI systems meets the conditions of defect-tolerance, test-compatibility and minimum hardware requirement. For this purpose, every module of the multi-dimensional systolic VLSI system has control logic allocated to it which controls A, B and C switches for the appertaining module. It is possible with the use of these switches to bridge a maximum of up to two faulty modules per row and one faulty module per column. A configuration algorithm provides a determination as to whether the established VLSI system is in the position to be able to execute the desired arithmetic operations.

19 Claims, 11 Drawing Sheets

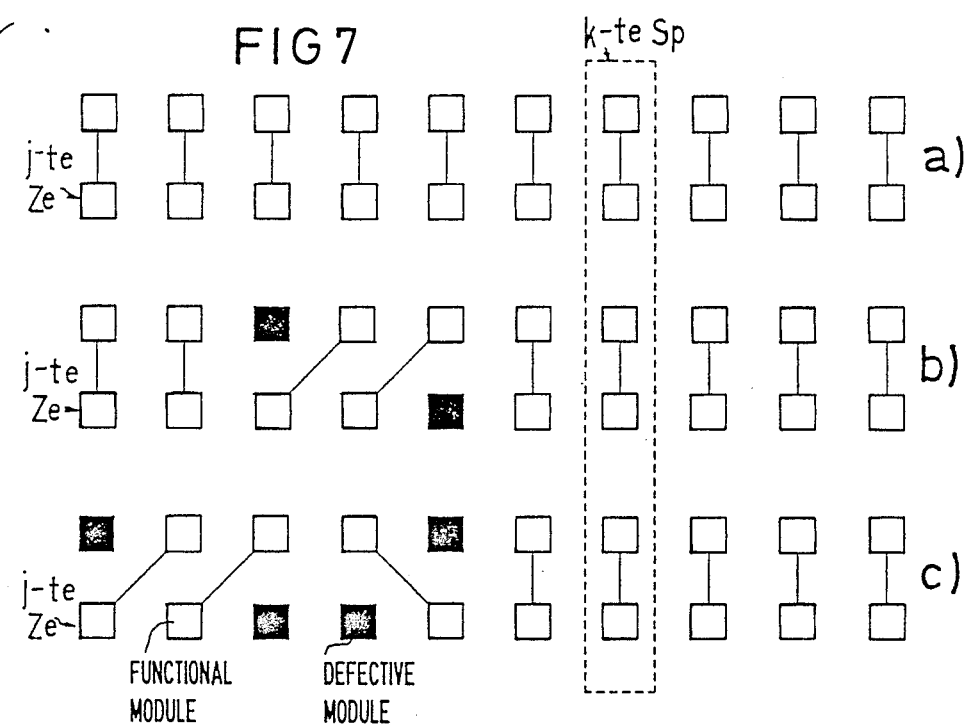
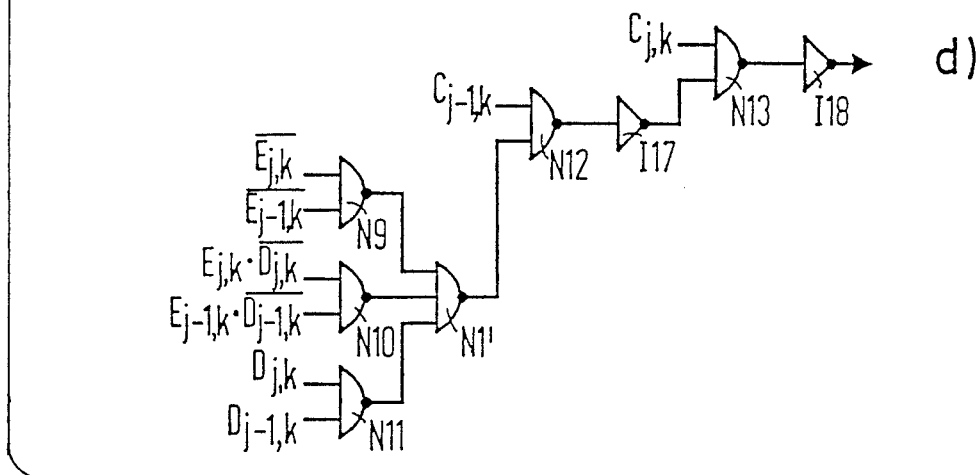

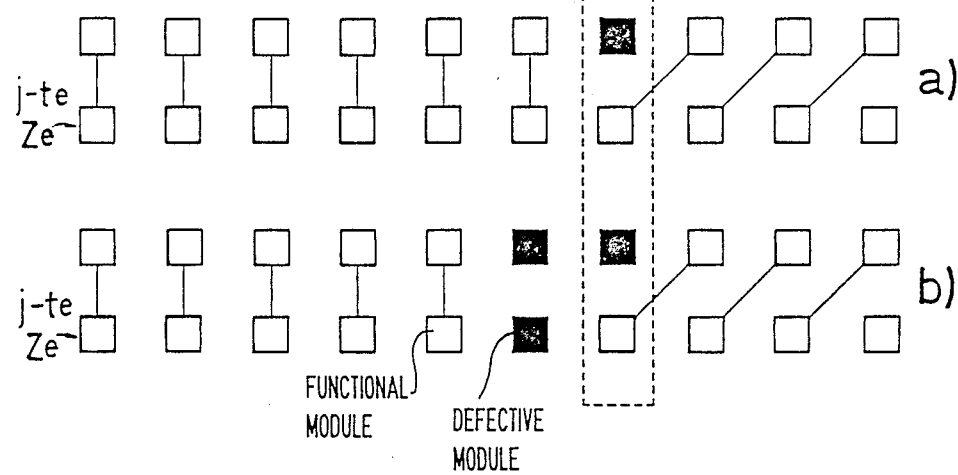
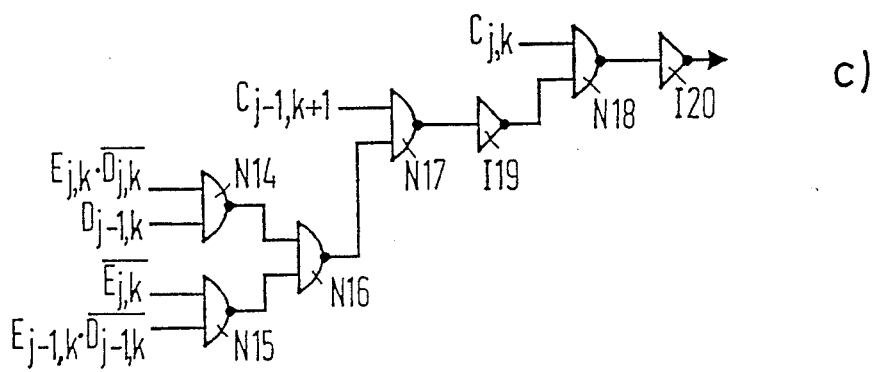
FIG 8

METHOD AND APPARATUS FOR MANUFACTURING A TEST-COMPATIBLE, LARGELY DEFECT-TOLERANT CONFIGURATION OF REDUNDANTLY IMPLEMENTED, SYSTOLIC VLSI SYSTEMS

BACKGROUND OF THE INVENTION

The present invention relates in general to large-area, defect-tolerant VLSI integration such as, for example, LAI (large area integration) or WSI (wafer scale integration) which is beneficial for the integration of systems having an extremely high plurality of more than $10^6$ transistors. These systems can be designed with proven CMOS technology and have already reached orders of magnitude that will only be available with future submicron technology (in this respect, see the publication by Doctor Ramacher, "A Cost Oriented Redundancy Model for Defect-Tolerant VLSI/WSI Systems", Adam Hilger, Proc. of the Workshop on the Designing for Yield, January 1988). Configuration algorithms and configuration procedures have the function of locating a sub-set of function modules from a set of redundantly implemented function modules and to activate connections, so that a prescribed function (for example, an algorithm or a sequence of instructions) can be run on the configured set. One precondition for redundant implementations is that they can only be realized in systems whose architecture has a high degree of regularity. Systolic fields are extremely well suited for this purpose. An algorithm that allows mapping onto a two-dimensional, systolic field is a matrix-matrix multiplication, for example. Desirable for a large-area monolithic integration are:

(a) fault tolerance, i.e. effects appearing in the hardware realization of the configuration procedure do not prevent a configurability of the overall system;

(b) test compatibility, i.e., the system test needed for non-redundant design is used for the redundantly implemented system without additional hardware to detect the described defects and which activates a new configuration; and (c) a minimum hardware requirement.

An article, "Wafer Scale Integration-Fault-Tolerant Procedure", by Aubusson and Catt, in IEEE J. Solid State, Volume SC-13, No. 3, June 1978, describes an effective algorithm for one-dimensional fields. Another publication by the authors J. H. Kim, S. M. Reddy, "On the Design of Easily Testable and Reconfigurable VLSI Processor Arrays", Workshop on Designing for Yield, Oxford 1987, disclose designs which meet the demands for (a) test compatibility, (b) defect tolerance and (c) minimum hardware to only an extremely limited extent. The publication, "Reconfiguration Architectures for VLSI Processing Arrays", Proc. of IEEE, May 1986, pages 712 through 722 by M. Sami and R. Steffanelli describes large-area monolithic integrations that do not at all meet the three demands of defect tolerance, test compatibility and minimum hardware requirement.

As a consequence of their regularity, systolic fields are extremely well-suited for a redundant system design. An effective configuration algorithm, but only for one-dimensional systolic fields, is disclosed in the aforementioned publication by Aubusson and Catt. However, a configuration procedure for two-dimensional, systolic fields that has the qualities of (a) defect tolerance (b) test compatibility and (c) minimum hardware requirement cannot be derived from this publication.

SUMMARY OF THE INVENTION

An object of the present invention is to provide a method and an apparatus for the configuration of redundantly implemented, systolic VLSI systems that meet the conditions of (a) defect tolerance, (b) test compatibility and (c) minimum hardware requirement.

The method has the steps of:

supplying to modules in a first row of the VLSI system composed of modules arranged in rows and columns, k selector bits having a 0/1 settings and k first input variables ($a_{11} \ldots a_{1k}$) and k.k second input variables ($b_{11} \ldots b_{kk}$) and logical variables ($Z_j, \overline{k-1}, C_j, \overline{D_j}, \overline{k-1}, E_j, \overline{k-1}$) where k is a whole number and whereby the logical variables have fixed values; generating, k output variables ($c_{11}, \ldots .c_{1k}$) from arithmetic operations with the selector bits, input variables and logical variables in the modules;

checking the output variables, corresponding to the executed arithmetic operations, for negative and positive results;

for a negative result, supplying k selector bits to the VLSI system with a new 0/1 setting;

repeating steps of supplying k selector bits, executing arithmetic operations, and checking the result of the arithmetic operation until either a positive result is obtained in the check or all 0/1 settings for the k selector bits have been utilized;

storing the k selector bits having the 0/1 setting when a positive check result is obtained;

executing for all modules arranged in rows in the VLSI system the steps of applying k selector bits having a 0/1 setting, applying input variables, applying the logical variables, executing arithmetic operations, checking for positive and negative results and storing the k selector bits having the 0/1 setting for a positive check result; and describing the configuration for the VLSI system by all stored selector bits having the 0/1 setting.

Since the method for configuration of the VLSI system (configuration algorithm) refers to a matrix-matrix multiplication, the individual modules of the systolic field advantageously have a simple structure. The problems that go hand-in-hand with the configuration and testing of systolic fields can be fully addressed. The configuration algorithm presented here can therefore be transferred without restriction to a two-dimensional field of RISC processors, for example. The design of such a LAI/WSI system can then concentrate on the systolic mapping of an adequately large set of algorithms from the field of general and intelligent pattern processing (voice and image processing).

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several FIGS. in which like reference numerals identify like elements, and in which:

FIGS. 7a through 7c depict configurations that activate the switch B1;

FIG. 7d is a circuit diagram of the gate level for the drive of the switch B1;

FIGS. 8a and 8b depict configurations that activate the switch B2;

FIG. 8c is a circuit diagram of the gate level for the drive of the switch B2;

FIGS. 11a and 11b depict configurations that activate the switch B5;

FIG. 11c is a circuit diagram of the gate level for the drive of the switch B5;

DESCRIPTION OF THE PREFERRED EMBODIMENT

Figure 1:
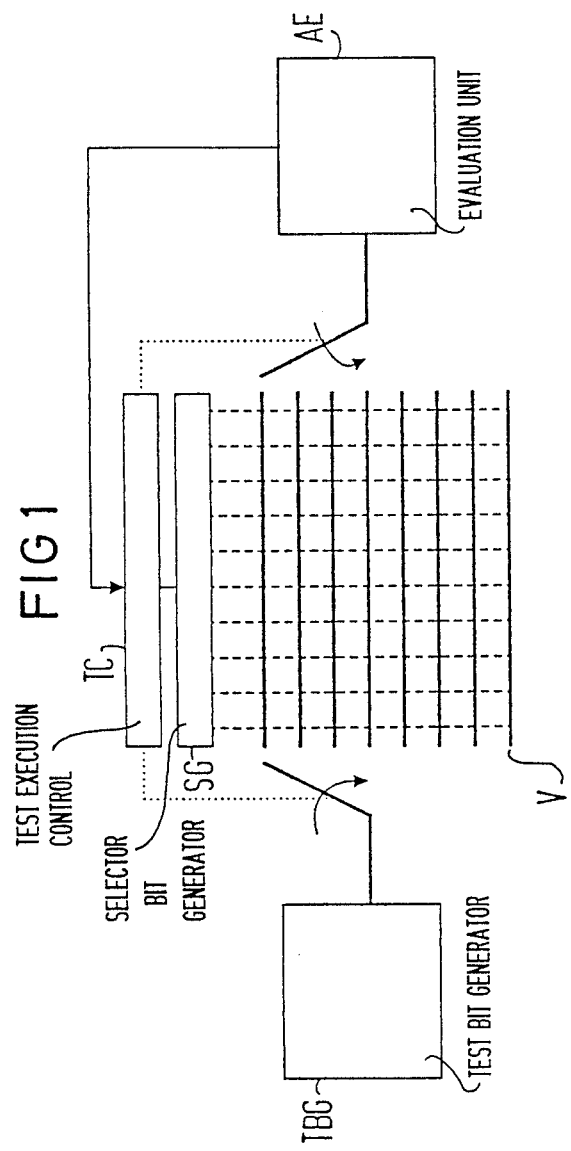
FIG. 1 schematically depicts an arrangement for the implementation of the configuration algorithm for a redundantly implemented, systolic VLSI system.

An apparatus for the production of a test-compatible, largely defect-tolerant configuration for redundantly implemented, systolic VLSI systems shown in general in FIG. 1 contains a VLSI system V composed of a total number N' of modules arranged in rows and columns, contains a test execution control TC, a test bit generator TBG, an evaluation unit AE and a selector bit generator SG. The test execution control TC that controls the running of the entire test procedure, outputs a set of selector bits via the selector bit generator SG and, finally, activates or deactivates the modules by rows for the test procedure. The test execution control TC first is connected to the selector bit generator SG, and, second, is connected by rows to the control inputs (not shown) on the VLSI system that is indicated in FIG. 1 by switches at both sides of the system and that shall be set forth in greater detail in FIG. 5. A respective selector bit activates or deactivates the modules in a column of the VLSI system in accordance with its 0/1 setting and the modules in the desired row are activated by enable signals at the control inputs of the VLSI system. The test bit generator TBG for supplying the input variables is connected by rows to the inputs of the VLSI system V, whereas the evaluation unit AE for checking the result of the executed arithmetic operations from the input variables is connected row-by-row to the outputs of the VLSI system.

The size of the VLSI system in the embodiment is 8×10 modules, and the matrix-matrix multiplication that is to be used requires only 8×8 modules. Two steps are needed in order to combine a defined plurality (eight in the present case) of function modules from a great number (ten in the present case) of redundantly implemented modules to form a desired system, as follows:

(a) a construction of a line network for output data for every arbitrary combination of eight of the ten modules; and (b) a test of each and every such construction by inputting test patterns represented by logical input variables from the test bit generator TBG and evaluation of the output pattern represented by output variables in the evaluation unit AE.

The method for producing a test-compatible, largely defect-tolerant configuration for redundantly implemented systolic VLSI systems initially provides row-by-row testing of the individual modules. With the use of selector bit generator SG and enable signals on the control inputs of the VLSI system V, the individual modules in a row are rendered functional or non-functional in accordance with the 0/1 setting of selector bits. In the present case, eight of ten modules thereby remain in operation row-by-row. After activation of the individual modules, A and B input variables are first applied to the inputs of the VLSI system for the first row.

The results of the executed arithmetic operations, in this case, a multiplication of the input variables, is provided row-by-row at the outputs of the VLSI system and is supplied to an evaluation unit AE. For a a negative result of the executed arithmetic operations for a row, a new 0/1 setting of selector bits is generated for the row from the selector bit generator SG and a new selection of eight of ten modules in this case is selected for the execution of the arithmetic operations. This testing procedure is repeated until either all forty-five possibilities of an eight of ten configuration of the modules is tested in a row or until a configuration has been found that supplies a positive result in the executed arithmetic operations. When this is the case, then the selector bits used are stored in control logic, as set forth in FIG. 5. Upon implementation of the aforementioned method steps, the modules in the second, third and all further rows of the VLSI system are subsequently tested.

The arithmetic operations are matrix-matrix multiplication that is defined as $c_i$, $$k = \sum_{j=o}^{N} a_{i,j} \cdot b_{j,k},$$

for i, k=1 through N; in this case, $a_{i,j}$ and $b_{j,k}$ represent the input variables and $C_{j,k}$ represents the output variables for the arithmetic operation. The following resulting combinations for the input variables for testing the modules in the first row are:

$$a_1 \cdot b_1, a_1 \cdot b_2, \ldots a_1 \cdot b_8$$

with $$a_1 := (a_{11}, a_{12}, \ldots a_{18}),$$

$$b_1 := (b_{11}, b_{21}, \ldots b_{81}),$$

$$b_2 := (b_{12}, b_{22}, \ldots b_{82}),$$

$$b_8 := (b_{18}, b_{28}, \ldots b_{88}).$$

the output variable for this first row is:

$c_1 = (c_{11}, c_{12}, \ldots c_{18})$.

Figure 2:
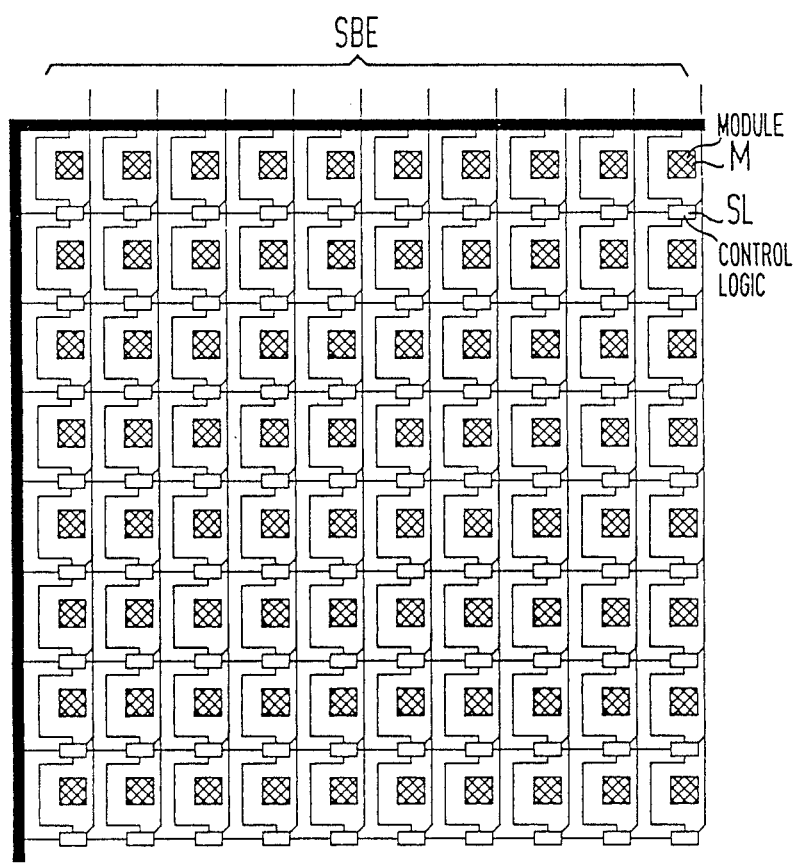
FIG. 2 schematically depicts an arrangement of the VLSI system of the present invention for the implementation of a matrix-matrix multiplication.

FIG. 2 shows the column-by-column and row-by-row arrangement of the modules M within a VLSI system. The interconnection of the individual modules M to one another is not shown for purposes of simplification. It can be seen that every module M has a control logic SL allocated to it that serves for the activation of the switches of the corresponding module M.

The control logic circuits SL of the modules M of a column are respectively serviced by a shared selector bit input, whereas the row-by-row activation of the modules is executed by supplying an enable signal (not entered here) to every control logic SL in a common row. It is possible to test the modules M row-by-row by this enabling signal and by the 0/1 setting of the selector bits at the selector bit inputs SBE. The regularity of the systolic field requires an interconnection of the control logics to one another, so that one control logic of one module is connected to respectively four other control logics that are situated in the immediate proximity thereof. This does not apply to the control logics that are situated at the periphery of the VLSI system. Here, the neighboring control logics are replaced by an interconnection of the peripheral control logics to permanently assigned 0 or 1 logic levels. This is indicated in FIG. 2 by the connection of the peripheral control logics to the outer bar limitation and shall be set forth again in greater detail in FIG. 5.

Figure 3:
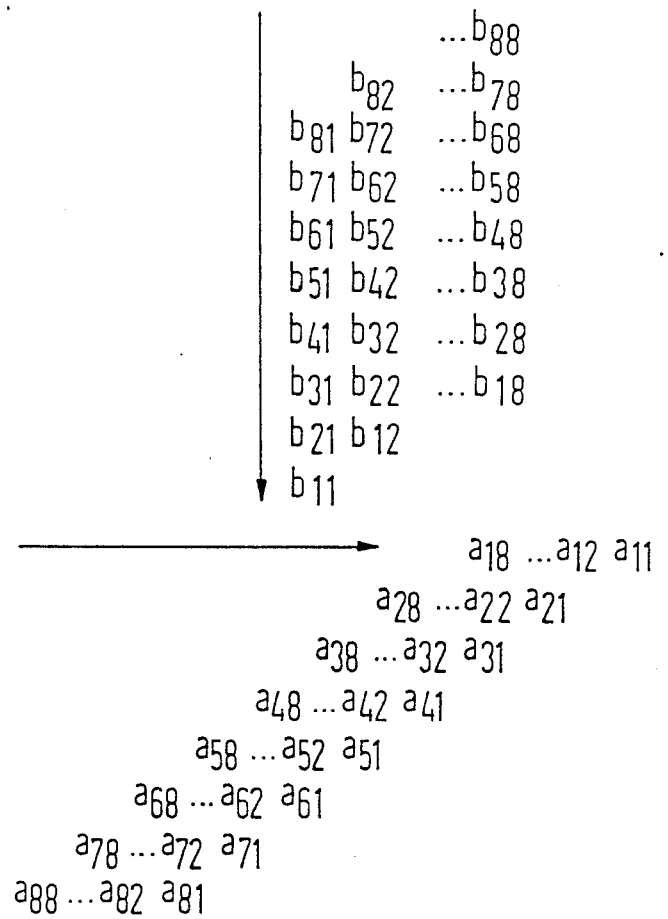
FIG. 3 is a diagram of the input of the input variables for the matrix-matrix multiplication.

FIG. 3 shows the input variables that are supplied to the VLSI system during normal operation for a matrix-matrix multiplication. The input variables of every row as well as of every column are applied with a delay of one clock step. The supply of the input variables for the modules in the first row consequently results in the following way:

The input variables $a_1 = (a_{11}, a_{12}, \ldots a_{18})$ as well as the input variables $b_1 = (b_{11}, b_{21}, \ldots b_{81})$ are supplied for the module in the first column and first row. The input variables $a_1 = (a_{11}, a_{12}, \ldots a_{18})$ and $(b_2 = b_{12}, b_{22}, \ldots b_{82})$ as supplied for the module in the second column of the first row. The input variables $a_1 = (a_{11}, a_{12}, \ldots a_{18})$ as well as $b_8 = (b_{18}, b_{28}, \ldots b_{88})$ as supplied for the module in the last column of the first row. The input variables for the remaining modules in the remaining rows as supplied analogously. For testing the modules for the configuration procedure, it is most meaningful to select identical input variables for every module in order to be able to execute a fast and simple check for a positive or negative result after the arithmetic operations have been carried out.

Figure 4:
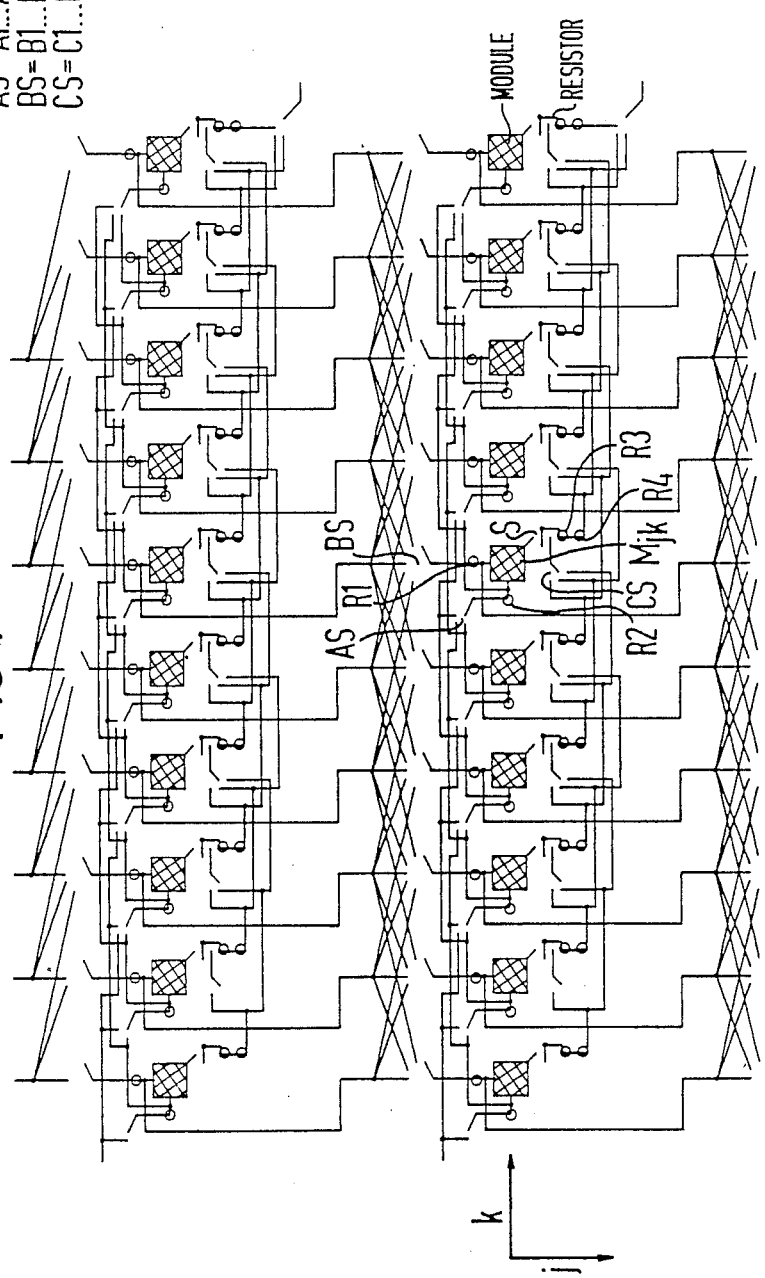
FIG. 4 schematically depicts a connection of the individual modules to one another in the VLSI system of the invention.

FIG. 4 shows the interconnection of the modules to one another, which was eliminated in FIG. 2 for reasons of clarity. The interconnection of the module $M_{jk}$ is representative of the interconnection of the remaining modules in the rows and columns of the VLSI system. The module $M_{jk}$ has an input connected via a register R1 to five B-switches BS, has a further input connected via a register R2 to three A-switches AS and has its output connected via the switch S to two series-connected output registers R3 and R4. The A-switches AS, B-switches BS and C-switches CS are located respectively preceding the registers. The A-switches and C-switches represent connections of the modules to one another in the row, whereas the B-switches BS provide for column-by-column interconnection of the modules.

A connection is provided between the register R1 and the input of the module $M_{jk}$ and also provides for connecting to five further B-switches of the modules in the j+1 row lying next-lower. These B-switches are respectively arranged in the j+1 row in the k−2, k−1, k, k+1 and k+2 columns. The B-switches BS of the module $M_{jk}$ likewise connects five further modules lying in the next-higher j−1 row that are respectively located in the k−2, k−1, k, k+1 and k+2 columns. The use of these bypasses that have been introduced and that are realized by the connecting lines and by the B-switches makes it possible to bridge defective modules in a column. A further connecting line that is connected between the register R2 and another input of the module $M_{jk}$ connects the A-switches of the modules lying at the right and next farthest toward the right that are situated in the k+1 and k+2 columns of the same row. The A-switches AS that precede the register R2 enable a selective connection, first, to the input of the module situated at the left in the same row, to which a further register analogous to the register R1 is allocated, in the k−1 column, as well as a connection to the A-switches of the modules in the k−2 and k−3 column of the same row. A connection to the A-switches of the modules in the k+1 and k+2 column of the same row is simultaneously enabled.

The output of the module $M_{jk}$ is connected via a switch S to two series-connected output registers R3 and R4, whereby the output of the output register R4 enables a connection to further C-switches of the modules lying at the right and second toward the right in the k+1 and k+2 column of the same row. The switch S selectively switches the output of the module $M_{jk}$ or one of the three positions of C-switch CS of the module $M_{jk}$ onto the output register R3. The C-switch CS further connects the output register R3 via the switch S selectively to the series-connected, two output registers of the modules that are arranged in the same row but in the k−3, k−2 and k−1 column. A connection to the C-switches of the modules in the k+1 and k+2 column of the same row is enabled at the same time. The A-switches AS and the C-switches CS of the module $M_{jk}$ is synchronously switched, i.e. when the A-switches AS produces a connection between the register R2 of the module $M_{jk}$ to that input belonging to the register R2 in the module located in the k−1 column and the same row, then the C-switch, via the switch S, produces a connection to the output register R3 of the module $M_{jk}$ to the two series-connected output registers of the module arranged in the k−1 column and in the same row. This is also validly transferred to the remaining two switches of the A-switches AS and C-switches CS.

Figure 5:
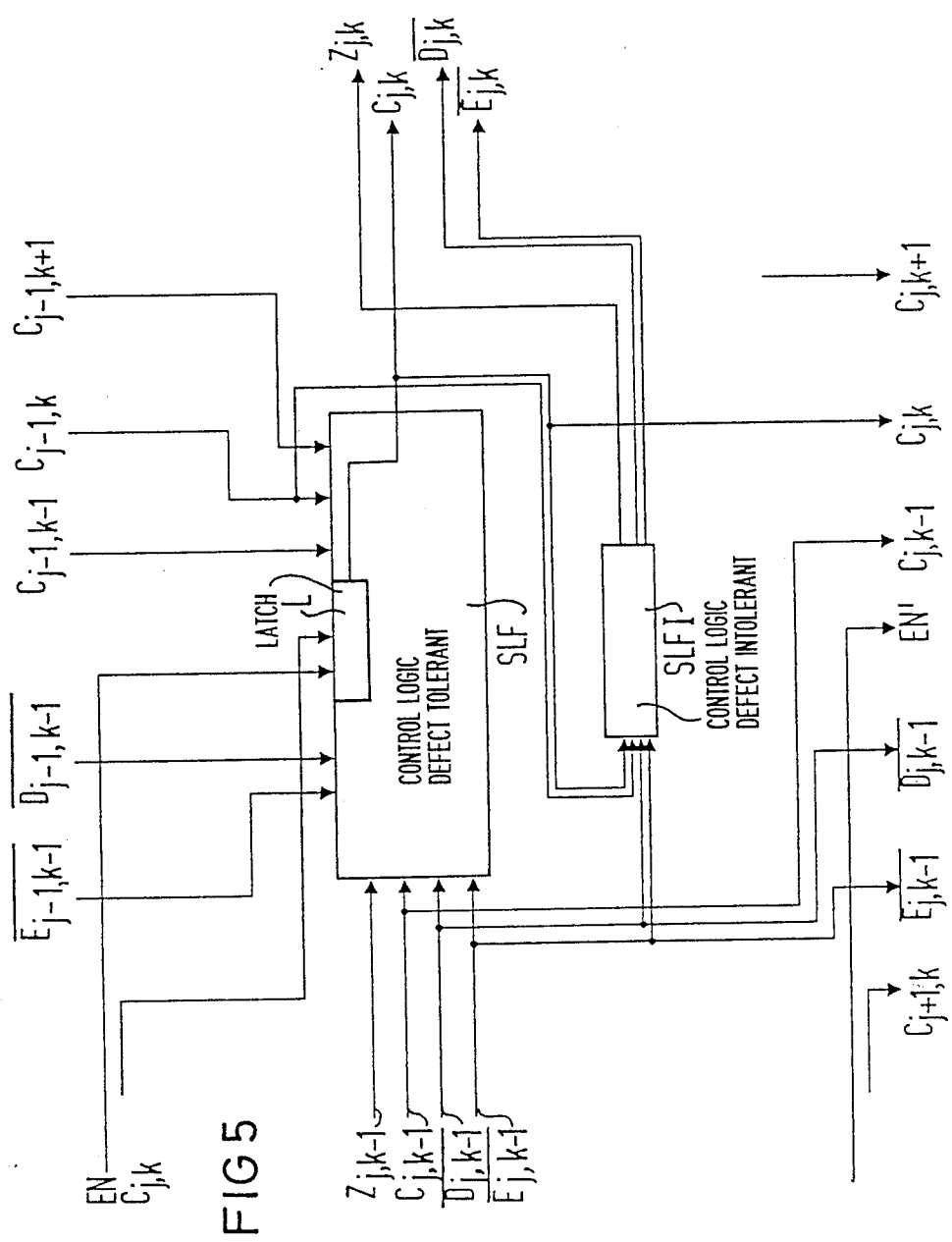
FIG. 5 is a block diagram of the control logic of each module for the drive of the A, B, C switches of each and every module.

FIG. 5 shows the control logic that is divided into a defect-intolerant part SLFI and into a defect-tolerant part SLF. The A, B and C switches AS, BS, CS of the appertaining module $M_{jk}$ are controlled by the control logic. Overall ten logical variables must be made available to the control logic. The horizontal control line train is thereby four bits wide and covers the logical variables $Z_{j, k-1}$, $C_{j, k-1}$, $\overline{D_{j, k-1}}$ and $\overline{E_{j, k-1}}$ or respectively, $Z_{j, k}$, $C_{j, k}$, $\overline{D_{j, k}}$ and $\overline{E_{j, k}}$; the vertical control line train is six bits wide and derives from the logical variables $C_{j, k}$, $\overline{E_{j-1, k-1}}$, $\overline{D_{j-1, k-1}}$, $C_{j-1, k-1}$, $C_{j-1, k}$ and $C_{j-1, k+1}$ or, respectively, $C_{j+1, k}$, $\overline{E_{j, k-1}}$, $\overline{D_{j, k-1}}$, $C_{j, k-1}$, $C_{j, k}$ and $C_{j, k+1}$. A definition of the logical variables is as follows:

$C_{j,k} = 0$ when the module $M_{jk}$ is deactivated:
$C_{j,k} = 1$ when the module $M_{jk}$ is activated;
$E_{j,k} = 0$ when a defect exists in the row j up to and including the column k;

$E_{j,k} = 1$ when precisely one defect exists in the row j up to and including the column k:

$D_{j,k} = 0$ when no two defects exist in the row j up to and including the column k, $D_{j,k} = 1$ when exactly two defects exist in the row j up to and including the column k;

$Z_{j,k} = 0$ when at most one of the modules $M_{jk-1}$ or $M_{jk}$ is defective; and $Z_{j,k} = 1$ when both modules $M_{jk-1}$ and $M_{jk}$ are defective.

What is thereby always valid is that when the logical variable $D = 1$, then the logical variable $E = 1$; and, when the logical variable $E = 0$, then the logical variable $D = 0$.

The local control logic is redundantly implemented. This can be done only for a skillful allocation of the A, B and C switches AS, BS, CS in that the control logic acts on the module $M_{jk}$ via the switches. A defect in the control logic then only affects the module $M_{jk}$. That part of the control logic SLFI that fowards the horizontal information to the remainder of the row is not defect-tolerant because a defect would be accepted by all remaining modules. By contrast, the control logic SLF processing the vertical information is defect-tolerant because erroneous information can only be transmitted up to the module of the next row and can be reconfigured there. The defect-tolerant part of the control logic SLF is five times larger than the defect-intolerant part SLFI. The horizontal control line train that forwards the information to the remainder of the row is four bits wide and contains three control lines that supply the logical output variables $Z_{j,k}$, $\overline{D_{j,k}}$ and $\overline{E_{j,k}}$ that are generated from the defect-intolerant part SLFI of the control logic. A fourth logical variable $C_{j,k}$ is acquired from the vertical control line train via a latch L in the defect-tolerant control logic part SLF. The vertical control line train that forwards the information to the modules in the next row is six bits wide and is composed of the logical variables $\overline{D_{j,k-1}}$, $\overline{E_{j,k-1}}$, $\overline{C_{j,k-1}}$, $C_{j,k}$, $C_{j+1,k}$, and $C_{j,k+1}$. The first four logical variables are directly generated from the corresponding, logical input variables, whereas the last two logical variables are taken from the neighboring control logics.

The values for the logical variables for the control logics that are located at the periphery of the VLSI system result from the following initial conditions: $C_{0, k-1} = 1$ for $k = 1, \ldots 10$; $E_{0, k-1} = 0$, and $D_{0, k-1} = 0$ for $k = 1, \ldots 10$; $C_{1, 0} = 1$, $D_{1, 0} = E_{1, 0} = 0$; $Z_{1, 0} = X$ (don't care), whereby these logical variables are hard-wired in accordance with the initial conditions.

The logical variable $C_{j, k}$ is connected to all control logics of the k row; at the same time, it forms one part of the selector bit inputs SBE from FIG. 2. For activation of the control logic situated in a specific row, the defect-tolerant part SLF is further additionally supplied with an enable signal EN or EN' for the j and j+1 row respectively. Since one enable signal is allocated per row for the control logics, an overall plurality of eight enable signals results for the overall VLSI system. The use of the logical input variables $C_{j,k}$ and of the enable signals makes it possible to activate or deactivate every individual module in the VLSI system during the configuration algorithm.

Figure 6:
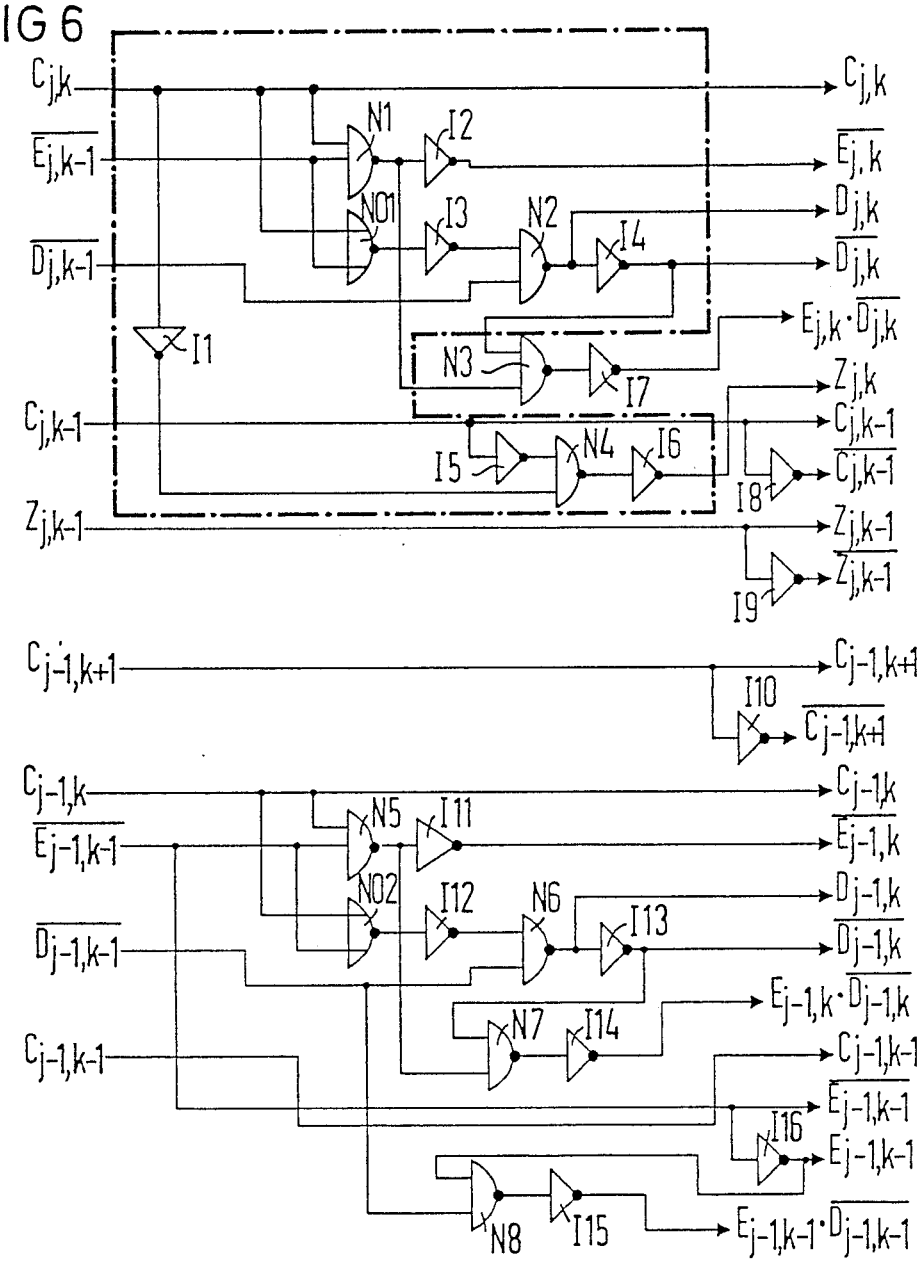
FIG. 6 is a circuit diagram of the gate level for the control logic of FIG. 5.
Figure 9:
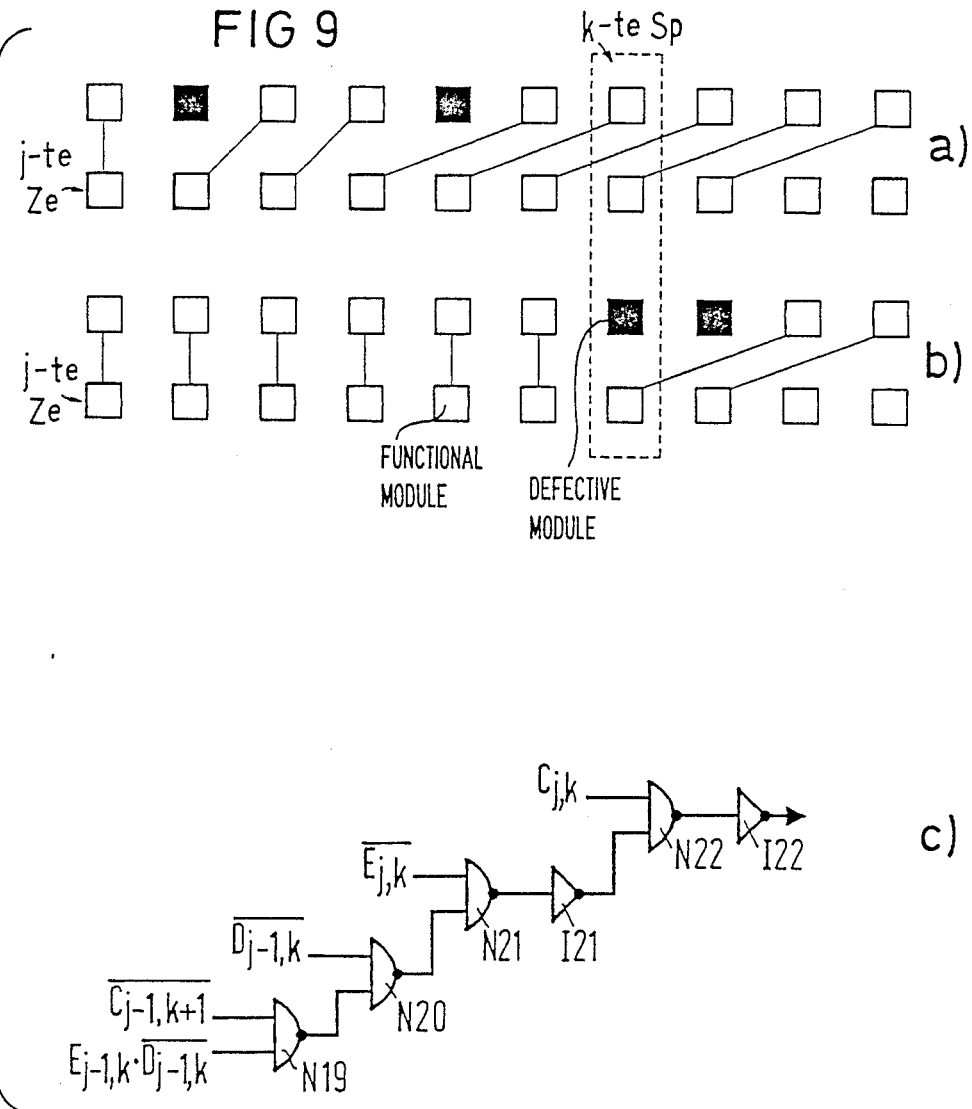
FIGS. 9a, 9b depict configurations that activate the switch B3.
FIG. 9c is a circuit diagram of the gate level for the drive of the switch B3.
Figure 10:
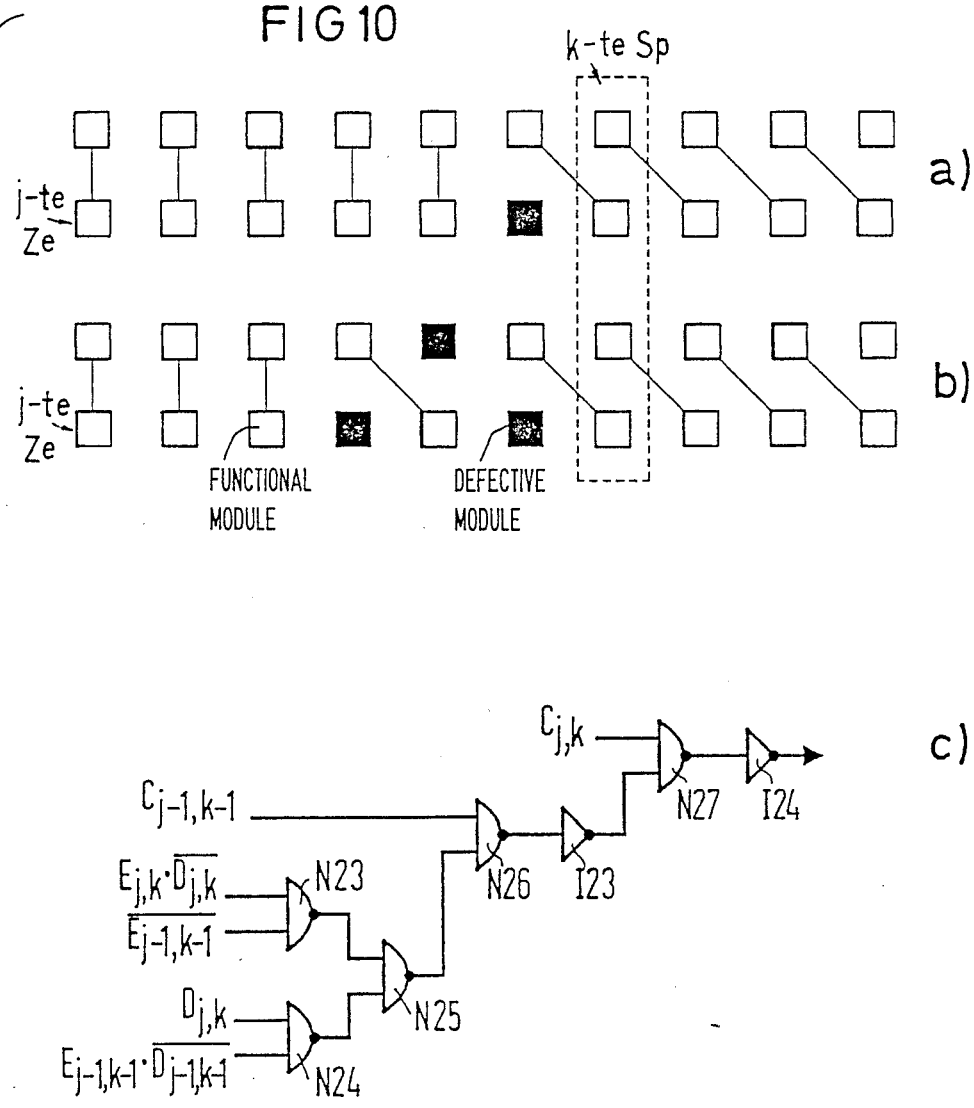
FIGS. 10a and 10b depict configurations that activate the switch B4.
FIG. 10c is a circuit diagram of the gate level for the drive of the switch B4.

A circuit on the gate level for the control logic of FIG. 5 is shown in FIG. 6. In order to control the A, B, C switches of each and every module, a total of 21 logical variables are required; these, however, can be acquired from the ten logical input variables for the control logic that have already been cited in FIG. 5. The ten logical input variables for the control logic are $C_{j,k}$, $\overline{E_{j,k-1}}$, $\overline{D_{j,k-1}}$, $C_{j,k-1}$, $Z_{j,k-1}$, $C_{j-1, k+1}$, $C_{j-1, k}$, $E_{j-1, k-1}$, $D_{j-1, k-1}$ and $C_{j-1, k-1}$. The logical output variables of the control logic, whereof the first four represent defect-intolerant output variables, are as follows: $C_{j, k}$, $\overline{E_{j, k}}$, $\overline{D_{j,k}}$, $Z_{j,k}$, $D_{j,k}$, $E_{j,k} \cdot \overline{D_{j,k}}$ $C_{j, k-1}$, $\overline{C_{j, k-1}}$, $Z_{j,k-1}$, $\overline{Z_{j,k-1}}$, $C_{j-1, k+1}$, $\overline{C_{j-1, k+1}}$, $C_{j-1, k}$, $\overline{E_{j-1, k}}$, $D_{j-1, k}$, $\overline{D_{j-1, k}}$, $E_{j-1, k} \cdot \overline{D_{j-1, k}}$, $C_{j-1, k-1}$, $\overline{E_{j-1, k-1}}$, $E_{j-1, k-1}$ and $E_{j-1, k-1} \cdot \overline{D_{j-1, k-1}}$. These twenty-one logical output variables are utilized for the drive of the five B-switches of FIGS. 7d, 8c, 9c, 10c and 11c as well as for the drive of the A and C switches of FIG. 12. The part of the circuit shown in broken lines in FIG. 6 represents the defect-intolerant part of the control logic; defective gates or inverters in this region cause reactions on the remaining control logics of the modules located in the same row. A defect in the defect-tolerant part of the circuit of FIG. 6 or in the gate logic for the control variables for the drive of the A, B, C switches has no affect whatsoever on other modules and can be simply bypassed by bridging the defective module with its control unit.

The interconnection of the eight NAND gates, fifteen inverters and one NOR gate is as follows. The logical input variable $C_{j,k}$ forms, first, a logical output variable $C_{j,k}$, second, it is connected to a first input of a first NAND gate N1; a second logical input variable $\overline{E_{j, k-1}}$ is connected to a second input of the first NAND gate N1 and to a first input of a first NOR gate NO1. The logical input variable $C_{j,k}$ is connected to the second input of the first NOR gate N01 and the logical input variable $\overline{D_{j, k-1}}$ is connected to the first input of a second NAND gate N2. An output of the first NAND gate N1 is connected to a first input of a third NAND gate N3 and the logical input variable $C_{j,k}$ is connected via a first inverter I1 to a first input of a fourth NAND gate N4. An output of the first NAND gate N1 supplies the logical output variable $\overline{E_{j,k}}$ via a second inverter I2. An output of the first NOR gate N01 is connected via a third inverter I3 to the second input of the second NAND gate N2 and an output of the second NAND gate N2 is connected via a fourth inverter I4 to, first, a second input of the third NAND gate N3 and, second, supplies the logical output variable $\overline{D_{j,k}}$. The logical input variable $C_{j, k-1}$ is connected via a fifth inverter I5 to a second input of the fourth NAND gate N4 and an output of the fourth NAND gate N4 supplies the logical output variable $Z_{j, k}$ via a sixth inverter I6. The output of the second NAND gate N2 supplies the logical output variable $D_{j, k}$ and an output of the third NAND gate N3 supplies the logical output variable $E_{j,k} \cdot \overline{D_{j, k}}$ via a seventh inverter I7. The logical input variable $C_{j, k-1}$ supplies, first, the logical output variable $C_{j, k-1}$ and, second, supplies the logical output variable $\overline{C_{j, k-1}}$ via an eighth inverter I8. The logical input variable $Z_{j, k-1}$ forms, first, the logical output variable $Z_{j, k-1}$ and, further, supplies the logical output variable $\overline{Z_{j, k-1}}$ via a ninth inverter I9. Likewise, the logical input variable $C_{j-1, k+1}$ yields the output variable $C_{j-1, k+1}$ and supplies the negated output variable $\overline{C_{j-1, k+1}}$ via a tenth inverter I10.

The logical input variable $C_{j-1, k}$ further yields the logical output variable $C_{j-1, k}$ and is connected to a first input of a fifth NAND gate N5 and to a first input of a second NOR gate N02. The logical input variable $\overline{E_{j-1, k-1}}$ is connected, first, to the second input of the fifth NAND gate N5 and, second, is connected to a second input of the second NOR gate N02. The output of the fifth NAND gate N5 supplies the logical output variable $\overline{E_{j-1,k}}$ via an eleventh inverter I11. The output of the second NOR gate N02 is connected via a twelfth inverter I12 to a first input of a sixth NAND gate N6, whereby the logical output variable $D_{j-1,k}$ can be taken at the output of the sixth NAND gate N6 which also supplies the logical output variable $\overline{D_{j-1,k}}$ via a thirteenth inverter I13. The output of the fifth NAND gate N5 and the output of the thirteenth inverter I13 are each connected to inputs of a seventh NAND gate N7 and the output of the seventh NAND gate N7 is connected to a fourteenth inverter I14 at whose output the logical output variable $E_{j-1,k} \cdot \overline{D_{j-1,k}}$ can be taken. The logical input variable is $D_{J-1,K}$-connected, first, to a second input of the sixth NAND gate N6 and, second, to a first input of an eighth NAND gate N8 and the logical input variable $\overline{E_{j-1,k-1}}$ corresponds to the logical output variable $\overline{E_{j-1,k-1}}$ and can be taken as logical output variable $E_{j-1,k-1}$ via a sixteenth inverter I16. The output of the sixteenth inverter I16 is connected to a second input of the eighth NAND gate N8 and the output of the eighth NAND gate N8 is connected to a fifteenth inverter I15 at whose output the logical output variable $E_{j-1,k-1} \cdot \overline{D_{j-1,k-1}}$ can be taken. Finally, the logical input variable $C_{j-1,k-1}$ likewise forms the logical output variable $C_{j-1,k-1}$.

The defect configurations that activate the A, B or C switches as well as the realization of the associated drive logic shall be set forth in the following FIGS. The respective output of this drive logic serves for the activation of the corresponding switches via transmission gates that are not shown in FIGS. 7 through 12.

FIGS. 7a through 7d specify the defect configurations that activate the switches B1 as well as the gate realization of the logical definition. The switch B1 produces a connection of the module $M_{j-1,k}$ to the module $M_{j,k}$, i.e. a connection between two modules that are situated in the k column and respectively in the j and j−1 rows. The prerequisite therefore is that both modules are functional. The connecting lines between the modules of FIGS. 7a through 7c indicate that these modules participate in the arithmetic operations, for example in the matrix-matrix multiplication, and are functional, whereas those modules that are represented by solid black squares in FIGS. 7a through 7c and have no connecting lines to remaining modules represent defective or faulty modules. It may be seen that no such non-functional module is present in FIG. 7a, in contrast to FIG. 7b where one respective defective module occurs per row and by contrast to FIG. 7c wherein two respective defective modules occur per row. It is then important for activation of the B1-switch that the single defects of FIG. 7b or the double defects of FIG. 7c have occurred in both rows up to the k column. When this is the case, then the switch B1, for example, produces the connection between a module $M_{j,k}$ and a module $M_{j-1,k}$ in the k column, this meaning that both modules in the k column that lie horizontally relative to one another participate in the arithmetic operations, for example in the matrix-matrix multiplication.

The logical definition of the control variables for the B1-switch reads:

$$B1 = C_{j-1,k} \cdot C_{j,k} \cdot (\overline{E_{j-1,k} \cdot E_{j,k}}) +$$

$$(E_{j-1,k} \cdot E_{j,k} \cdot \overline{D_{j-1,k}} \cdot \overline{D_{j,k}}) + (D_{j-1,k} \cdot D_{j,k})).$$

Such a realization is reproduced on the gate level in FIG. 7d. The B1-switch is constructed of a total of six NAND gates N9, N10, N11, N12, N13 and N1' as well as by two inverters I17 and I18. The logical output variables from the control logic of FIG. 6 are respectively applied here to the inputs of the NAND gates N9, N10, N11, N12 and N13. The logical output variable $\overline{E_{j,k}}$ as well as the logical output variable $\overline{E_{j-1,k}}$ is respectively applied to inputs of the ninth NAND gate N9, the logical output variables $E_{j,k} \cdot \overline{D_{j,k}}$ as well as the logical output variables $E_{j-1,k} \cdot \overline{D_{j-1,k}}$ are respectively applied to inputs of the NAND gate N10 and, finally, the logical output variables $D_{j,k}$ and $D_{j-1,k}$ are applied to the inputs of the NAND gate N11. The outputs of the ninth NAND gate N9, of the tenth NAND gate N10 and of the eleventh NAND gate N11 are respectively connected to inputs of a NAND gate N1' having three inputs and whose output is connected to a first input of the NAND gate N12. The second input of the NAND gate N12 is connected to the logical output variable $C_{j-1,k}$ whereas the output of the twelfth NAND gate N12 is connected via a seventeenth inverter I17 to a first input of the thirteenth NAND gate N13. The second input of the thirteenth NAND gate N13 is connected to the logical output variable $C_{j,k}$ and the output signal for the B1-switch can be taken at the output of the thirteenth NAND gate N13 via an eighteenth inverter I18.

FIGS. 8a through 8c indicate the defect configurations that activate the switches B2 and also show the realization on the gate level for the drive of the switch B2. Faulty or defective modules are likewise indicated by black squares in FIGS. 8a and 8b. The B2-switch produces a connection of modules $M_{j-1,k+1}$ to modules $M_{j,k}$. This means a connection, for example, from a module of the j−1 row and k+1 column to a module in the j row j−te Ze and k column k−te Sp. The prerequisite therefore is that both modules are functional. It may be seen from FIG. 8a that exactly one defective module occurs in the j−1 row up to the k column, whereas two non-functional modules are present in FIG. 8b in the j−1 row and one non-functional module is present in the j row up to the k column. What both FIGS. have in common is that the difference in defective modules between the j−1 and j rows amounts to exactly one. The switch takes effect precisely when this difference up to and including the k column amounts to exactly one.

The logical definition of the control variables for the B2-switch reads:

$$B2 = C_{j,k} \cdot C_{j-1,k+1} \cdot ((E_{j-1,k} \cdot \overline{D_{j-1,k}}) +$$

$$(E_{j,k} \cdot D_{j-1,k} \cdot \overline{D_{j,k}})).$$

A realization corresponding to this logical definition of the B2-switch is shown in FIG. 8c. It is composed of a total of five NAND gates N14, N15, N16, N17 and N18 as well as of two inverters I19 and I20. The logical output variables from the control logic of FIG. 6 are again connected to inputs of these NAND gates. The logical output variables $E_{j,k} \cdot \overline{D_{j,k}}$ as well as the logical output variable $D_{j-1,k}$ are respectively connected to inputs of the fourteenth NAND gate N14 and the logical output variables from the control logic $\overline{E_{j,k}}$ and the logical output variable $E_{j-1,k} \cdot \overline{D_{j-1,k}}$ are each connected to inputs of the fifteenth NAND gate N15. The outputs of the fourteenth NAND gate N14 as well as of the fifteenth NAND gate N15 are respectively connected to inputs of the sixteenth NAND gate N16. The output thereof is in turn connected to a first input of the seventeenth NAND gate N17. The second input of the seventeenth NAND gate N17 is connected to the logical output variable $C_{j-1, k+1}$ and the output of the seventeenth NAND gate N17 is connected via a nineteenth inverter I19 to a first input of the eighteenth NAND gate N18. The second input of this eighteenth NAND gate is in turn connected to a logical output variable $C_{j, k}$ and the output of the eighteenth NAND gate N18 forms the output of the B2-switch via the twentieth inverter I20.

Defect configurations that activate the switch B3 are shown in FIGS. 9a and 9b and a realization of the drive thereof on the gate level is shown in FIG. 9c. The switch B3 produces a connection between module $M_{j-1, k+2}$ and module $M_{j, k}$. This, for example, means a connection from a module in the $j-1$ row and $k+2$ column to a module in the j row and k column. The prerequisite therefore is again that these modules are functional. A comparison between FIGS. 9a and 9b shows that exactly two non-functional or defective modules occur in both FIGS. in the $j-1$ row. The switch B3 is activated when the plurality of defective modules in the $j-1$ row up to the $k+1$ column is exactly 2. Defective modules are again identified with black squares in FIGS. 9a and 9b.

The logical definition of the control variables for the B3-switch reads:

$$B3 = C_{j, k} \cdot \overline{E_{j, k}} \cdot (D_{j-1, k} + \overline{C_{j-1, k+1}} \cdot E_{j-1, k} \cdot \overline{D_{j-1, k}}).$$

The realization of this logical definition by four NAND gates NI9, N20, N21 and N22 as well as by two inverters I21 and I22 is shown in FIG. 9c. Logical output variables from the control logic of FIG. 6 are again applied to the four NAND gates. The logical output variables $\overline{C_{j-1, k+1}}$, and $E_{j-1, k} \cdot \overline{D_{j-1, k}}$ are connected to inputs of the nineteenth NAND gate N19 whose output is connected to a first input of the twentieth NAND gate N20. A second input of the twentieth NAND gate N20 is connected to the logical output variable $\overline{D_{j-1, k}}$. The output of the twentieth NAND gate N20 is connected to a first input of the twenty-first NAND gate N21 at whose second input the logical input variable $\overline{E_j, k}$ is received. The output of the twenty-first NAND gate N21 is connected via an inverter I21 to a first input of the twenty-second NAND gate N22. The logical output variable $C_{j, k}$ is connected to the second input of the twenty-second NAND gate N22 and the output of the twenty-second NAND gate N22 forms the output of the B3-switch via the inverter I22.

FIGS. 10a and 10b show the defect configuration that activates the switch B4 and FIG. 10c shows a realization of the drive thereof on the gate level. The switch B4 produces a connection between a module $M_{j-1, k-1}$ and a module $M_{j, k}$. That is a connection from a module in the $j-1$ row and $k-1$ column to a module in the j row and k column. The prerequisite therefor is again that both modules are functional. A comparison of FIGS. 10a and 10b shows that one more non-functional module is present in the j row than in the $j-1$ row. The switch B4 is then activated when the difference in the number of non-functional modules between the j and $j-1$ row up to and including the $k-1$ row is exactly one. Faulty modules are identified by black squares just as in FIGS. 7 through 9.

The logical definition of the control variables for the B4-switch reads:

$$B4 = C_{j-1, k-1} \cdot C_{j, k} \cdot ((\overline{E_{j-1, k-1}} \cdot E_{j, k} \cdot \overline{D_{j, k}}) +$$
$$(E_{j-1, k-1} \cdot \overline{D_{j-1, k-1}} \cdot D_{j, k})).$$

The realization of this logical definition is reproduced in FIG. 10c. It contains five NAND gates N23, N24, N25, N26 and N27 as well as two inverters I23 and I24. The logical output variables of the control logic of FIG. 6 are again applied to the inputs of the NAND gates, whereby the logical output variable $D_{j, k}$ as well as the output variable $E_{j-1, k-1} \cdot \overline{D_{j-1, k-1}}$ is each connected to an input of the twenty-fourth NAND gate N24 and the logical output variable $E_{j, k} \cdot \overline{D_{j, k}}$ as well as the logical output variable $\overline{E_{j-1, k-1}}$ are each connected to an input of the twenty-third NAND gate N23. The outputs of the twenty-third NAND gate N23 and of the twenty-fourth NAND gate N24 are connected to inputs of the twenty-fifth NAND gate N25 and an output of the twenty-fifth NAND gate N25 is connected to a first input of the twenty-sixth NAND gate N26. A second input of the NAND gate N26 supplies the logical output variable $C_{j-1, k-1}$ and the output of the twenty-sixth NAND gate N26 is connected via a twenty-third inverter I23 to a first input of the twenty-seventh NAND gate N27. The logical output variable $C_{j, k}$ is connected to a second input of the NAND gate N27. The output of the NAND gate N27 forms the output of the switch B4 via an inverter I24.

FIGS. 11a and 11b show defect configurations that activate the last of the B-switches B5 and FIG. 11c shows a realization on the gate level for the drive of the switch B5. The switch B5 produces a connection between a module $M_{j-1, k-2}$ and a module $M_{j, k}$, i.e. between a module in the $j-1$ row and $k-2$ column and a module in the j row and k column. The prerequisite therefore is that the module $M_{j, k}$ is functional. A comparison of the defect configuration of FIG. 11a and FIG. 11b shows that two defective modules respectively occur in the j row whereof however, two defective modules immediately follow one another in one row in FIG. 11a and at least one functional module exists in FIG. 11b in the j row between defective modules. In addition, a faulty module appears in the $j-1$ row and $k-1$ column of FIG. 11a and in the $j-1$ row and k column in FIG. 11b. The switch B5 is activated when no faulty module occurs in the $j-1$ row up to the $k-2$ row and two non-functional modules occur in the j row up to the k column.

The logical definition of the control variables for the B5-switch reads:

$$B5 = C_{j, k} \cdot D_{j, k} \cdot (E_{j-1, k-1} + (E_{j-1, k-1} \cdot \overline{D_{j-1, k-1}} \cdot \overline{C_{j-1, k-1}})).$$

FIG. 11c shows a realization of this logical definition on the gate level with four NAND gates N28, N29, N30 and N31 as well as with three inverters I25, I26 and I27. The logical output variable $C_{j-1, k-1}$ is connected via a twenty-fifth inverter I25 to a first input of the twenty-eighth NAND gate N28 to whose second input the logical output variable $E_{j-1, k-1} \cdot \overline{D_{j-1, k-1}}$ is connected. The output of the NAND gate N28 is connected to a first input of the twenty-ninth NAND gate N29 to whose second input the logical output variable $E_{j-1, k-1}$ is connected. The output of the twenty-ninth NAND gate N29 is connected to an input of the thirtieth NAND gate N30 whose second input is connected to the logical output variable $D_{j,\,k}$. The output of the NAND gate N30 is connected via a twenty-sixth inverter I26 to a first input of the thirty-first NAND gate N31 to whose second input the logical output variable $C_{j,\,k}$ is connected. The output of the NAND gate N31 is connected via a twenty-seventh inverter I27 and forms the output of the switch B5.

Figures 11, 12:
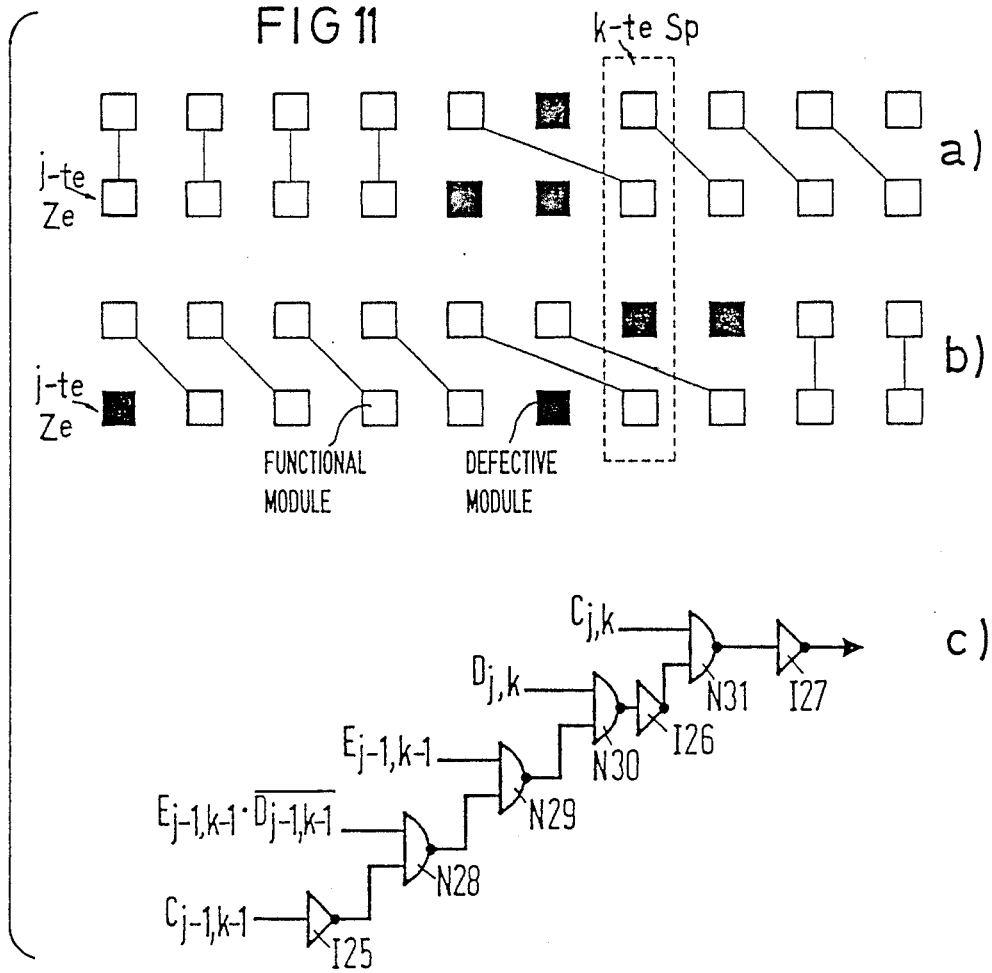
FIG. 12 is a circuit diagram of the gate for the drive of the switches A or C.

FIG. 12 shows the realization for the drive of the three A-switches and three C-switches that each have the same control logic. The logical equations of the control variables for the two switches read:

$$A1 \text{ or } C1 = C_{j,\,k-1} \cdot C_{j,\,k}$$

$$A2 \text{ or } C2 = \overline{Z_{j,\,k-1}} \cdot C_{j,\,k-1} \cdot C_{j,\,k}$$

$$A3 \text{ or } C3 = Z_{j,\,k-1} \cdot \overline{C_{j,\,k-1}} \cdot C_{j,\,k}.$$

A realization of these logical equations is provided by three NAND gates N32, N2' and N3' as well as by three inverters I28, I29 and I30. The logical output variables $C_{j,\,k}$ and $C_{j,\,k-1}$ are connected to inputs of the thirty-second NAND gate N32 and the logical output variable $C_{j,\,k}$ also is connected to an input of the NAND gate N2' composed of three inputs and to an input of NAND gate N3' that is likewise composed of three inputs. Further, the logical output variables $\overline{C_{j,\,k-1}}$ and $\overline{Z_{j,\,k-1}}$ are connected to inputs of the NAND gate N2' and the logical output variables $\overline{C_{j,\,k-1}}$ and $Z_{j,\,k-1}$ are connected to inputs of the NAND gate N3'. The outputs of the three NAND gates are each connected via an inverter, so that the output of the thirty-second NAND gate N32 forms a first output via a twenty-eighth inverter I28 for the drive of the A1 switch or the C1 switch and the output of the NAND gate N2' forms the second output via a twenty-ninth inverter I29 for the drive of the A2 switch or the C2 switch. Likewise, the output of the NAND gate N3' is connected via a thirtieth inverter I30 and forms the third output for the drive of the A3 switch or the C3 switch.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. An apparatus for producing a test-compatible, largely defect-tolerant configuration for redundantly implemented, systolic VLSI systems comprising:
   a VLSI system having N' modules arranged in rows and columns, a test execution control, a test bit generator, an evaluation unit and a selector bit generator;
   the test execution control being connected to the VLSI system via the selector bit generator;
   the selector bit generator having outputs connected column-by-column to each of the modules;
   outputs of the test bit generator that generates input variables being supplied row-by-row to the VLSI system; and
   the evaluation unit connected row-by-row to outputs of the modules in the VLSI system.

2. The apparatus according to claim 1, wherein every module in a row is connected to a module lying next in the row, separated by one module or separated by two modules, being connected thereto by A-switches at first inputs and C-switches at outputs of the module; and wherein every module in a row is connectable by B-switches at a second input of the module to the module in the next-higher row that is situated directly there opposite and to the module lying directly there opposite to one of the right, the left and the module lying directly there opposite that is second toward the right or second toward the left.

3. The apparatus according to claim 2, wherein a register is located preceding each of the two inputs of each and every module and a register pair is located at every output of a module.

4. The apparatus according to claim 2, wherein each one of the N' modules located in rows and columns has a control logic allocated to it; and wherein the control logic controls the A, B, C switches for the module; and wherein every control logic is divided into a defect-tolerant part and defect-intolerant part.

5. The apparatus according to claim 4, wherein the VLSI system is constructed of $8 \times 10$ modules.

6. The apparatus according to claim 5, wherein the defect-intolerant part contains inputs for four defect-intolerant logic variables and outputs for four defect-intolerant logic variables;
   and wherein the first defect-intolerant input variable ($C_{j,\,k}$) forms the first defect-intolerant output variable ($C_{j,\,k}$) and is also connected to a first input of a first NAND gate;
   wherein a second defect-intolerant input variable ($\overline{E_{j,\,k-1}}$) is connected to a second input of the first NAND gate and to a first input of a first NOR gate;
   wherein the first defect-intolerant input variable ($C_{j,\,k}$) is connected to a second input of the first NOR gate;
   wherein the third defect-intolerant input variable ($\overline{D_{j,\,k-1}}$) is connected to a first input of a second NAND gate;
   wherein an output of the first NAND gate is connected to a first input of a third NAND gate;
   wherein the first defect-intolerant input variable ($C_{j,\,k}$) is connected via a first inverter to a first input of a fourth NAND gate;
   wherein an output of the first NAND gate provides an output via a second inverter for the second defect-intolerant output variable $\overline{E_{j,\,k}}$);
   wherein an output of the first NOR gate is connected via a third inverter to the second input of the second NAND gate and an output of the second NAND gate is connected via a fourth inverter to, first, the second input of the third NAND gate and, second, provides the third defect-tolerant output variable ($\overline{D_{j,\,k}}$) at an output of the defect-intolerant part;
   wherein a defect-tolerant input variable ($C_{j,\,k-1}$) is provided via a fifth inverter to a second input of the fourth NAND gate;
   wherein an output of the fourth NAND gate provides the fourth defect-tolerant output variable ($Z_{j,\,k}$) via a sixth inverter;
   and wherein the fourth defect-intolerant input variable ($C_{j-1,\,k}$) provides a defect-tolerant output variable ($C_{j-1,\,k}$).

7. The apparatus according to claim 6, wherein that the defect-tolerant part contains inputs for ten defect-tolerant input variable and outputs for seventeen defect-tolerant output variables;

wherein the first defect-tolerant input variable ($C_{j, k}$) is the first defect-intolerant input variable, the second defect-intolerant input variable ($\overline{E_{j, k-1}}$) is the second defect-tolerant input variable, the third defect-tolerant input variable ($\overline{D_{j, k-1}}$) is the third defect-intolerant input variable and the fourth defect-tolerant input variable ($C_{j-1, k}$) is the fourth defect-intolerant input variable;

wherein the output of the second NAND gate provides the first defect-tolerant output variable ($D_{j, k}$);

wherein an output of the third NAND gate supplies the second defect-tolerant output variable ($E_{j, k}\overline{D_{j, k}}$) via a seventh inverter;

wherein the fifth defect-intolerant input variable ($C_{j, k-1}$) provides the third defect-tolerant output variable ($C_{j, k-1}$) and, via an eighth inverter provides the fourth defect-tolerant output variable ($\overline{C_{j, k-1}}$);

wherein that the sixth defect-tolerant input variable ($Z_{j, k-1}$) forms the fifth defect-tolerant output variable ($Z_{j, k-1}$) and provides the sixth defect-tolerant output variable ($\overline{Z_{j, k-1}}$) via a ninth inverter;

wherein the seventh defect-tolerant input variable ($C_{j-1, k+1}$) corresponds to the seventh defect-tolerant output variable ($C_{j-1, k+1}$) and forms the eighth defect-tolerant output variable ($\overline{C_{j-1, k+1}}$) via a tenth inverter;

wherein the fourth defect-tolerant input variable ($C_{j-1, k}$), is a defect-tolerant output variable and is the ninth defect-tolerant output variable ($C_{j-1, k}$) and is connected to a first input of a fifth NAND gate and to a first input of a second NOR gate, the eighth defect-tolerant input variable ($\overline{E_{j-1, k-1}}$) being connected, first, to the second input of the fifth NAND gate and, second, to a second input of the second NOR gate, an output of the fifth NAND gate providing the tenth defect-tolerant output variable ($\overline{E_{j-1, k}}$) via an eleventh inverter, the output of the second NOR gate being connected via a twelfth inverter to a first input of a sixth NAND gate, whereby the eleventh defect-tolerant output variable ($D_{j-1, k}$) can be taken at the output of the sixth NAND gate and provides the twelfth defect-tolerant output variable ($\overline{D_{j-1, k}}$) via a thirteenth inverter;

wherein the output of the fifth NAND gate and the output of the thirteenth inverter are each respectively connected to respective inputs of a seventh NAND gate;

wherein an output of the seventh NAND gate is connected to a fourteenth inverter at whose output the thirteenth defect-tolerant output variable ($E_{j-1, k}\overline{D_{j-1, k}}$) can be taken;

wherein the ninth defect-tolerant input variable ($\overline{D_{j-1, k-1}}$) is connected, first, to a second input of the sixth NAND gate and, second to a first input of an eighth NAND gate;

wherein the eighth defect-tolerant input variable ($\overline{E_{j-1, k-1}}$) is the fifteenth defect-tolerant output variable ($\overline{E_{j-1, k-1}}$) and provides the sixteenth defect-tolerant output variable ($E_{j-1, k-1}$) via a sixteenth inverter;

wherein an output of the sixteenth inverter is connected to a second input of the eighth NAND gate and an output of the eighth NAND gate is connected to a fifteenth inverter at whose output the seventeenth defect-tolerant output variable ($E_{j-1, k-1}\overline{D_{j-1, k-1}}$) can be taken;

and wherein the tenth defect-tolerant input variable ($C_{j-1, k-1}$) is the fourteenth defect-tolerant output variable ($C_{j-1, k-1}$).

8. The apparatus according to claim 7, wherein the control logic of each and every module has five B-switches, three A-switches, and three C-switches allocated to it;

wherein a first B-switch (B1) produces a connection between a module in the $j-1$ row an a second module in the j row, whereby both modules lie horizontally relative to one another;

wherein a second B-switch (B2) produces a connection between a third module in the j row and a fourth module in the $j-1$ row, whereby the fourth module in the $j-1$ row is located one module to the right of the third module;

wherein a third B-switch (B3) produces a connection between a fifth module in the j row and a sixth module in the $j-1$ row, whereby the sixth module in the $j-1$ row is located offset two modules to the right from the fifth module;

wherein a fourth B-switch (B4) produces a connection between a seventh module in the j row and an eighth module in $j-1$ row, whereby the eighth module in the $j-1$ row is located one module to the left of the seventh module;

wherein a fifth B-switch (B5) produces a connection to a ninth module in the j row and tenth module in the $j-1$ row, whereby the tenth module is located offset two modules to the left of the ninth module;

wherein a first A-switch (A1) produces a connection between an input for the first input variables of a module in the j row and k column and an input for the first input variables of a further module in the j row and $k-1$ column and to A-switches in the j row and $k+1$ column and $k+2$ column;

wherein the second A-switch (A2) produces a connection between the input of the module in j row and k row to an input for the first input variables of a further module in the j row and $k-2$ column and to A-switches of modules in the j row and $k-1$ column and $k+1$ column;

wherein the third A-switch (A3) produces a connection between the input of the module in the j row and k column to an input for the first input variables of a further module in the j row and k-3 column and to A-switches of modules in the j row and $k-2$ column and $k-1$ column;

wherein the first C-switch (C1) produces a connection between a switch (S) at the output of the module in the j row and k column to output registers of a further module in the j row and $k-1$ column and C-switches of modules in the j row and $k+1$ and $k+2$ columns;

wherein the second C-switch (C2) produces a connection between the switch (S) to output registers of a further module in the j row and $k-2$ column and to C-switches of modules in the j row and $k-1$ and $k+1$ columns:

and wherein third C-switch (C3) produces a connection between the switch (S) to output registers of a further module in the j row and $k-3$ column and to C-switches of modules in the j row and $k-2$ and $k-1$ columns.

9. The apparatus according to claim 8, wherein the drive of the first B-switch contains six NAND gates, a ninth, a tenth, an eleventh, a twelfth, a thirteenth and a triple input NAND gate, as well as two inverters, a seventeenth and an eighteenth inverter;

wherein the second defect-intolerant output variable ($\overline{E_{j,k}}$) and the tenth defect-tolerant output variable ($E_{j-1,k}$) are each connected to inputs of the ninth NAND gate;

wherein the second defect-tolerant output variable ($E_{j,k} \cdot \overline{D_{j,k}}$) and the thirteenth defect-tolerant output variable ($E_{j-1,k} \overline{D_{j-1,k}}$) are connected to inputs of the tenth NAND gate (N10);

wherein the first defect-tolerant output variables ($D_{j,k}$) and the eleventh defect-tolerant output variable ($D_{j-1,k}$) are connected to inputs of the eleventh NAND gate;

wherein an output of the ninth NAND gate, an output of the tenth NAND gate and an output of the eleventh NAND gate are each respectively connected to first, second and third inputs of the first triple input NAND gate;

wherein an output of the first triple input NAND gate is connected to a first input of the twelfth NAND gate;

wherein the ninth defect-tolerant output variable ($C_{j-1,k}$) is connected to a second input of the twelfth NAND gate and the output of the twelfth NAND gate is connected via a seventeenth inverter to a first input of the thirteenth NAND gate;

wherein a second input of the thirteenth NAND gate is connected to a first defect-tolerant output variable ($C_{j,k}$) and an output of the thirteenth NAND gate forms the output via an eighteenth inverter for the control of the first B-switch.

10. The apparatus according to claim 8, wherein the drive of the second B-switch contains five NAND gates, a fourteenth, a fifteenth, a sixteenth, a seventeenth and an eighteenth NAND gate, and two inverters, a nineteenth and a twentieth inverter;

wherein the second defect-tolerant output variable ($E_{j,k} \cdot \overline{D_{j,k}}$) and the eleventh defect-tolerant output variable ($D_{j-1,k}$) are connected to inputs of the fourteenth NAND gate;

wherein the second defect-intolerant output variable ($\overline{E_{j,k}}$) and the thirteenth defect-tolerant output variable ($E_{j-1,k} \overline{D_{j-1,k}}$) are connected to inputs of the fifteenth NAND gate;

wherein an output of the fourteenth NAND gate and of the fifteenth NAND gate are connected to inputs of the sixteenth NAND gate;

wherein an output of the sixteenth NAND gate is connected to a first input of the seventeenth NAND gate;

wherein a second input of the seventeenth NAND gate is connected to the seventh defect-tolerant output variable ($C_{j-1,k+1}$);

wherein an output of the seventeenth NAND gate is connected via a nineteenth inverter to a first input of the eighteenth NAND gate;

wherein a second input of the eighteenth NAND gate is connected to the first defect-intolerant output variable ($C_{j,k}$);

and wherein an output of the eighteenth NAND gate forms the output via a twentieth inverter for the control of the second B-switch.

11. The apparatus according to claim 8, wherein the drive of the third B-switch contains four NAND gates, a nineteenth, a twentieth, a twenty-first, and a twenty-second NAND gate, and two inverters, a twenty-first and a twenty-second inverter;

wherein the eighth defect-tolerant output variable ($\overline{C_{j-1,k+1}}$) and the thirteenth defect-tolerant output variable ($E_{j-1,k} \overline{D_{j-1,k}}$) are connected to inputs of the nineteenth NAND gate;

wherein an output of the nineteenth NAND gate is connected to a first input of the twentieth NAND gate;

wherein that a second input of the twentieth NAND gate is connected to the twelfth defect-tolerant output variable ($\overline{D_{j-1,k}}$);

wherein an output of the twentieth NAND gate is connected to a first input of the twenty-first NAND gate;

wherein a second input of the twenty-first NAND gate is connected to a second defect-intolerant output variable ($\overline{E_{j,k}}$);

wherein an output of the twenty-first NAND gate is connected via a twenty-first inverter to a first input of a twenty-second NAND gate and a second input of the twenty-second NAND gate is connected to the first defect-intolerant output variable ($C_{j,k}$) and an output of the twenty-second NAND gate forms the output via a twenty-second inverter for the control of the third B-switch.

12. The apparatus according to claim 8, wherein the drive of the fourth B-switch contains five NAND gates, a twenty-third, a twenty-fourth, a twenty-fifth, a twenty-sixth and a twenty-seventh NAND gate, and two inverter, a twenty-third and a twenty-fourth inverter;

wherein the second defect-tolerant output variable ($E_{j,k} \overline{D_{j,k}}$) and the fifteenth defect-tolerant output variable ($\overline{E_{j-1,k-1}}$) are connected to inputs of the twenty-third NAND gate, and the first defect-tolerant output variable ($D_{j,k}$) and the seventeenth output variable ($E_{j-1,k-1} \cdot \overline{D_{j-1,k-1}}$) are connected to inputs of the twenty-fourth NAND gate;

wherein an output of the twenty-third NAND gate and an output of the twenty-fourth NAND gate are connected to inputs of the twenty-fifth NAND gate;

wherein an output of the twenty-fifth NAND gate is connected to a first input of the twenty-sixth NAND gate and a second input of the twenty-sixth NAND gate is connected to the fourteenth defect-tolerant output variable ($C_{j-1,k-1}$) and an output of the twenty-sixth NAND gate is connected via a twenty-third inverter to a first input of the twenty-seventh NAND gate to whose second input the first defect-intolerant output variable ($C_{j,k}$) is connected;

and wherein the output for the control of the fourth B-switch is formed at an output of the twenty-seventh NAND gate via a twenty-fourth inverter.

13. The apparatus according to claim 8, wherein the drive of the fifth B-switch contains four NAND gates, a twenty-eighth, a twenty-ninth, a thirtieth, and a thirty-first NAND gate and three inverter, a twenty-fifth, a twenty-sixth and a twenty-seventh inverter;

wherein a fourteenth defect-tolerant output variable ($C_{j-1,k-1}$) is connected via a twenty-fifth inverter to a first input of a twenty-eighth NAND gate;

wherein a second input of the twenty-eighth NAND gate is connected to a seventeenth defect-tolerant output variable ($E_{j-1,k-1} \cdot \overline{D_{j-1,k-1}}$);

wherein an output of the twenty-eighth NAND gate is connected to a first input of the twenty-ninth NAND gate;

wherein a second input of the twenty-ninth NAND gate is connected to a fifteenth defect-tolerant output variable ($E_{j-1, k-1}$);

wherein an output of the twenty-ninth NAND gate is connected to a first input of the thirtieth NAND gate;

wherein a second input of the thirtieth NAND gate is connected to a first defect-tolerant output variable ($D_{j, k}$);

wherein an output of the thirtieth NAND gate is connected via a twenty-sixth inverter to a first input of the thirty first NAND gate;

wherein a second input of the thirty first NAND gate is connected to the defect-intolerant output variable ($C_{j, k}$) and an output of the thirty-first NAND gate forms an output via a twenty-seventh inverter for the control of the fifth B-switch.

14. The apparatus according to claim 8, wherein the drives for the A-switches and C-switches are identically constructed;

wherein they each contain a thirty-second NAND gate and second and third triple input NAND gates, each having three inputs, and three inverters, a twenty-eighth, a twenty-ninth and a thirtieth inverter;

wherein the first defect-intolerant output variable ($C_{j, k}$) and the third defect-tolerant output variables ($C_{j, k-1}$) are connected to inputs of the thirty-second NAND gate;

wherein the defect-intolerant output variable ($C_{j, k}$) is connected to a first input of the second triple input NAND gate and to a first input of the third triple input NAND gate;

wherein the fourth defect-tolerant output variable ($\overline{C_{j, k-1}}$) and the sixth defect-tolerant output variable ($\overline{Z_{j, k-1}}$) are connected to second and third inputs, respectively of the second triple input NAND gate;

wherein the fourth defect-tolerant output variable ($\overline{C_{j, k-1}}$) and the fifth defect-tolerant output variable ($Z_{j, k-1}$) are connected to second and third inputs, respectively of the third triple input NAND gate;

wherein that an output of the thirty-second NAND gate forms a first output via a twenty-eighth inverter for the control of the first A-switch (A1) or the first C-switch (C1);

wherein an output of the second triple input NAND gate forms a second output via a twenty-ninth inverter for the control of the second A-switch (A2) or the second C-switch (C2); and wherein an output of the third triple input NAND gate forms a third output via a thirtieth inverter for the control of the third A-switch (A3) or the third C-switch (C3).

15. A method for the production of a test-compatible, largely defect-tolerant configuration of redundantly implemented, systolic VLSI systems, comprising the steps of:

supplying to modules in a first row of the VLSI system composed of modules arranged in rows and columns, k selector bits having a 0/1 settings and k first input variables ($a_{11} \ldots a_{1k}$) and k.k second input variables ($b_{11} \ldots b_{kk}$) and logical variables ($Z_{j, k-1}$, $C_{j, k-1}$, $D_{j, k-1}$, $E_{j, k-1}$,) where k is a whole number and whereby the logical variables have fixed values; generating, k output variables ($c_{11}, \ldots c_{1k}$) from arithmetic operations with the selector bits, input variables and logical variables in the modules;

checking the output variables, corresponding to the executed arithmetic operations, for a negative and positive results;

for a negative result, supplying k selector bits to the VLSI system with a new 0/1 setting;

repeating steps of supplying k selector bits, executing arithmetic operations, and checking the result of the arithmetic operation until either a positive result is obtained in the check or all 0/1 settings for the k selector bits have been utilized;

storing the k selector bits having the 0/1 setting when a positive check result is obtained:

executing for all modules arranged in rows in the VLSI system the steps of applying k selector bits having a 0/1 setting, applying input variables, applying the logical variables, executing arithmetic operations, checking for positive and negative results and storing the k selector bits having the 0/1 setting for a positive check result; and describing the configuration for the VLSI system by all stored selector bits having the 0/1 setting.

16. The method according to claim 15, wherein N functional modules are selected from N' redundantly implemented modules in the VLSI system after a positive check result in order to be able to carry out the arithmetic operations.

17. The method according to claim 16, wherein bypasses around nonfunctional modules are produced by the VLSI system, k selector bits, input variables and logical variables, said bypasses being produced in order to bridge said non-functional modules.

18. The method according to claim 17, wherein bypasses are generated that can bridge up to two nonfunctional modules lying side-by-side.

19. The method according to claims 15, wherein the arithmetic operations are multiplications for a matrix-matrix multiplication.

* * * * *